(12) United States Patent
Chi

(10) Patent No.: US 9,129,865 B2
(45) Date of Patent: Sep. 8, 2015

(54) DISPLAY PANEL AND DRIVING METHOD THEREOF

(71) Applicant: Au Optronics Corporation, Hsinchu (TW)

(72) Inventor: Cheng-Yiou Chi, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 186 days.

(21) Appl. No.: 13/924,611

(22) Filed: Jun. 23, 2013

(65) Prior Publication Data

US 2014/0009448 A1    Jan. 9, 2014

(30) Foreign Application Priority Data

Jul. 5, 2012    (TW) .............................. 101124262 A

(51) Int. Cl.
*G09G 5/00* (2006.01)
*H01L 27/12* (2006.01)
*G09G 3/36* (2006.01)
*H01L 29/417* (2006.01)

(52) U.S. Cl.
CPC ............ *H01L 27/124* (2013.01); *G09G 3/3648* (2013.01); *G09G 3/3685* (2013.01); *H01L 29/41733* (2013.01); *G09G 2300/0426* (2013.01); *G09G 2300/0447* (2013.01); *G09G 2300/0465* (2013.01); *G09G 2320/0242* (2013.01)

(58) Field of Classification Search
CPC ................ G09G 2300/0426; G09G 2320/028; G09G 2300/0465; G09G 2300/0439; G09G 2300/0447
See application file for complete search history.

(56) References Cited

U.S. PATENT DOCUMENTS

| 6,121,822 | A | 9/2000 | Merritt |
| 8,063,855 | B2 | 11/2011 | Takahara et al. |
| 8,654,271 | B2 * | 2/2014 | Lee et al. ................. 349/43 |
| 8,885,131 | B2 * | 11/2014 | Hirata et al. ............. 349/144 |
| 2008/0273131 | A1 * | 11/2008 | Kim ......................... 349/38 |
| 2010/0103339 | A1 | 4/2010 | Shimoshikiryoh et al. |
| 2010/0219414 | A1 | 9/2010 | Kim |
| 2010/0220116 | A1 * | 9/2010 | Liao et al. ................. 345/690 |
| 2011/0216260 | A1 * | 9/2011 | Park et al. ................ 349/41 |
| 2012/0019754 | A1 * | 1/2012 | Ting et al. ................ 349/123 |
| 2013/0100108 | A1 | 4/2013 | Chiang et al. |
| 2013/0128166 | A1 | 5/2013 | Chiang et al. |

FOREIGN PATENT DOCUMENTS

TW          I356937        1/2012
WO    WO 2011093387 A1 *  8/2011

* cited by examiner

*Primary Examiner* — Lixi C Simpson
(74) *Attorney, Agent, or Firm* — Jianq Chyun IP Office

(57) ABSTRACT

A display panel and a driving method thereof are provided. In a pixel array substrate of the display panel, each first transistor electrically connects to a corresponding first pixel electrode, each second transistor electrically connects to a corresponding second pixel electrode, each third transistor electrically connects to a corresponding third pixel electrode, and each fourth transistor electrically connects to a corresponding fourth pixel electrode. A plurality of data lines electrically connect to the corresponding first, second, third and fourth transistors. Each first scan line electrically connects to the first and third transistors. Each second scan line electrically connects to the second and fourth transistors. A plurality of third scan lines are located between the corresponding first and second scan lines and electrically connect to the corresponding third and fourth pixel electrodes via fifth transistors.

20 Claims, 5 Drawing Sheets

DISPLAY PANEL AND DRIVING METHOD THEREOF

CROSS-REFERENCE TO RELATED APPLICATION

This application claims the priority benefit of Taiwan application serial no. 101124262, filed on Jul. 5, 2012. The entirety of the above-mentioned patent application is hereby incorporated by reference herein and made a part of this specification.

BACKGROUND OF THE INVENTION

1. Field of the Invention

The invention is related to a display panel and a method of driving the display panel, and especially related to a display panel having a favorable aperture ratio and a method of driving the display panel.

2. Description of Related Art

In recent years, with the progress of semiconductor industry and relevant electronics industry, the use of digital appliances such as a mobile phone, a digital camera and a notebook computer becomes more and more common, and develops toward the direction of convenience, multi-function and good design, in order to provide users with more choices. As users' demand for digital products gradually increases, a display panel that plays an important role in digital products also becomes the focal point of designers' attention, wherein a liquid crystal display panel has become the mainstream of display panels.

Among current liquid crystal display panels, the vertical alignment (VA) mode liquid crystal display panel has a problem of color washout when viewed in a large viewing angle. FIG. 1 is a top-view schematic diagram of a portion of a conventional pixel array substrate. Referring to FIG. 1, to solve the problem of color washout in the liquid crystal display panel, each pixel 100 on a pixel array substrate 50 of the liquid crystal display panel may be divided into two portions, namely a primary pixel 110 and a secondary pixel 120, making the primary pixel 110 and the secondary pixel 120 have different voltages. When the primary pixel 110 and the secondary pixel 120 have different voltages, liquid crystal molecules within the same pixel 100 may have more arrangement directions, and then the problem of color washout that occurs in the liquid crystal display panel in the large viewing angle may be improved.

However, in order to make the liquid crystal display panel have the above effect in a driving method of a reverse scan, a scan line 140 has to be added into the same pixel 100. But the addition of the scan line 140 reduces the aperture ratio of each pixel 100 and leads to a lowered transmittance. Besides, in order to control signals transmitted to an original scan line 130 and the newly added scan line 140 respectively, the number of driver chips has to increase to a double of the original number, leading to an increased cost of products. Therefore, how to attend simultaneously to an ideal aperture ratio of the pixels, a lower overall cost and a solution to the problem of color washout of the liquid crystal display panel is an issue worth exploring in the design of the liquid crystal display panel.

SUMMARY OF THE INVENTION

The invention provides a display panel having a favorable aperture ratio.

The invention provides a driving method capable of solving a phenomenon of color washout of the display panel in a large viewing angle, while maintaining the favorable aperture ratio.

The invention provides a display panel, including a first substrate, a display medium, and a pixel array substrate. The display medium is configured between the first substrate and the pixel array substrate. The pixel array substrate includes a plurality of first pixel electrodes, a plurality of second pixel electrodes, a plurality of third pixel electrodes, a plurality of fourth pixel electrodes, a plurality of first scan lines, a plurality of second scan lines, and a plurality of third scan lines. Each of a plurality of first transistors electrically connects with one corresponding first pixel electrode, each of a plurality of second transistors electrically connects with one corresponding second pixel electrode, each of a plurality of third transistors electrically connects with one corresponding third pixel electrode, and each of a plurality of fourth transistors electrically connects with one corresponding fourth pixel electrode. The pixel array substrate includes a plurality of fifth transistors and a plurality of data lines, and each of the plurality of data lines electrically connects to the corresponding first, second, third, and fourth transistors. Each of the first scan lines electrically connects to the first and third transistors, and each of the second scan lines electrically connects to the second and fourth transistors. Each of the third scan lines is located between the corresponding first and second scan lines, and each of the third scan lines electrically connects to the corresponding third and fourth pixel electrodes via the fifth transistor.

According to an embodiment of the invention, the third pixel electrode of the display panel is located between the first and third scan lines electrically connected to the third pixel electrode.

According to an embodiment of the invention, the first and third pixel electrodes electrically connected to the first scan line of the display panel are located on the same side of the first scan line.

According to an embodiment of the invention, the fourth pixel electrode of the display panel is located between the second and third scan lines electrically connected to the fourth pixel electrode.

According to an embodiment of the invention, the second and fourth pixel electrodes electrically connected to the second scan line of the display panel are located on the same side of the second scan line.

According to an embodiment of the invention, the pixel array substrate of the display panel further includes a plurality of capacitors, wherein each of the fifth transistors is electrically connected between the corresponding capacitor and the corresponding third pixel electrode or electrically connected between the corresponding capacitor and the corresponding fourth pixel electrode.

According to an embodiment of the invention, the display medium of the display panel is a liquid crystal.

According to an embodiment of the invention, the first substrate of the display panel is a color filter substrate.

The invention provides a driving method for driving the display panel, and the driving method includes the following steps. In a first period within a frame period of the display panel, a first scan signal is provided to a No. i first scan line to turn on the plurality of first and third transistors electrically connected to the No. i first scan line. A plurality of first display data are correspondingly written into the plurality of first pixel electrodes electrically connected to the plurality of first transistors electrically connected to the No. i first scan line and the plurality of third pixel electrodes electrically connected to the plurality of third transistors electrically connected to the No. i first scan line via the plurality of data lines. The i is an integer equal to or larger than 1.

According to an embodiment of the invention, a second scan signal is provided to a No. i second scan line to turn on the plurality of second and fourth transistors electrically connected to the No. i second scan line in a second period within the frame period. A plurality of second display data are correspondingly written into the plurality of second pixel electrodes electrically connected to the plurality of second transistors electrically connected to the No. i second scan line and the plurality of fourth pixel electrodes electrically connected to the plurality of fourth transistors electrically connected to the No. i second scan line via the plurality of data lines.

According to an embodiment of the invention, a third scan signal is provided to a No. i third scan line to turn on the plurality of fifth transistors electrically connected to the No. i third scan line and to influence the plurality of first display data written into the plurality of third pixel electrodes electrically connected to the No. i first scan line and the plurality of second display data written into the plurality of fourth pixel electrodes electrically connected to the No. i second scan line in a third period within the frame period. In the third period, a fourth scan signal is synchronously provided to a No. i+1 first scan line to turn on the plurality of first and third transistors electrically connected to the No. i+1 first scan line. A plurality of third display data are correspondingly written into the first pixel electrodes electrically connected to the first transistors electrically connected to the No. i+1 first scan line and the third pixel electrodes electrically connected to the third transistors electrically connected to the No. i+1 first scan line via the plurality of data lines.

According to an embodiment of the invention, a fifth scan signal is provided to a No. i+1 second scan line to turn on the plurality of second and fourth transistors electrically connected to the No. i+1 second scan line in a fourth period within the frame period. A plurality of fourth display data are correspondingly written into the second pixel electrodes electrically connected to the second transistors electrically connected to the No. i+1 second scan line and the fourth pixel electrodes electrically connected to the fourth transistors electrically connected to the No. i+1 second scan line via the plurality of data lines.

The invention provides a display panel, including a first to fourth pixel electrodes, a first to fourth transistors, two fifth transistors, a data line, a first scan line, a second scan line and a third scan line. The first transistor electrically connects to the first pixel electrode, the second transistor electrically connects to the second pixel electrode, the third transistor electrically connects to the third pixel electrode, and the fourth transistor electrically connects to the fourth pixel electrode. One of the fifth transistors electrically connects to the third pixel electrode, and the other of the fifth transistors electrically connects to the fourth pixel electrode. The data line electrically connects to the first, second, third and fourth transistors. The first scan line electrically connects to the first and third transistors. The second scan line electrically connects to the second and fourth transistors, and the third scan line electrically connects to the two fifth transistors.

According to an embodiment of the invention, the first scan line is configured to receiving a first scan signal to turn on the first transistor and the third transistor, and the data line is configured to correspondingly write a first display data into the of the first pixel electrode and the third pixel electrode.

Based on the above, the display panel of the invention uses a design of sharing the third scan line to make the display panel obtain the favorable aperture ratio. In addition, the driving method of the invention drives the display panel that adopts the design of the shared third scan line, and solves the problem of color washout of the display panel.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Several exemplary embodiments accompanied with drawings are described in detail below to further describe the invention in detail.

Figure 1:
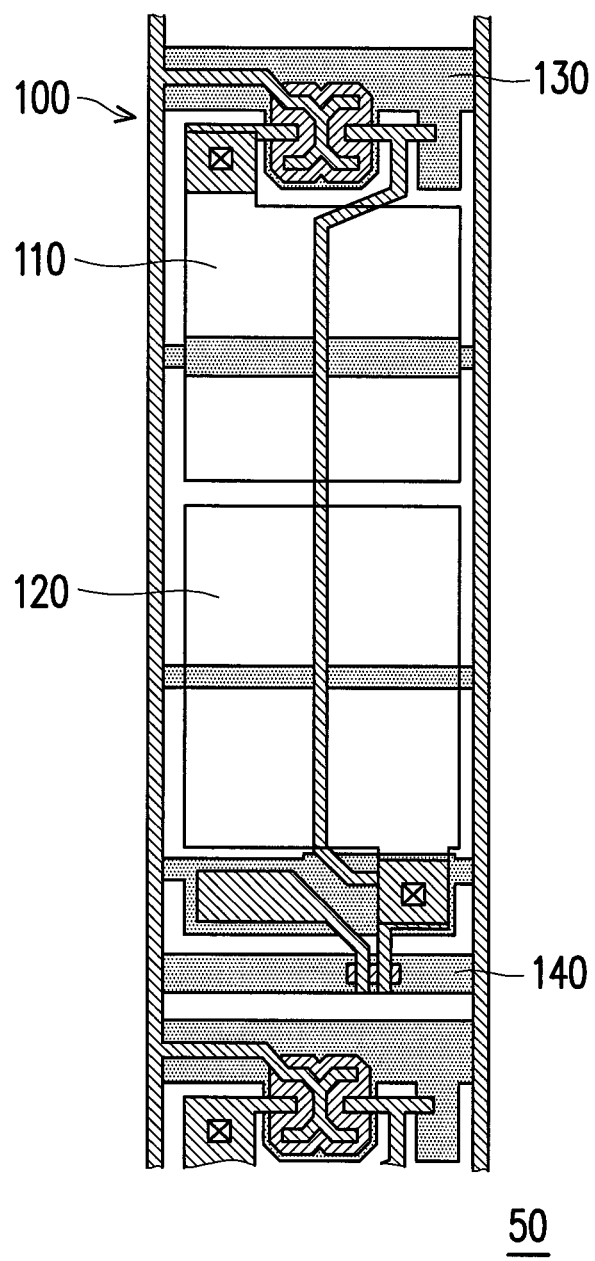
FIG. 1 is a top-view schematic diagram of a portion of a conventional pixel array substrate.
Figure 2:
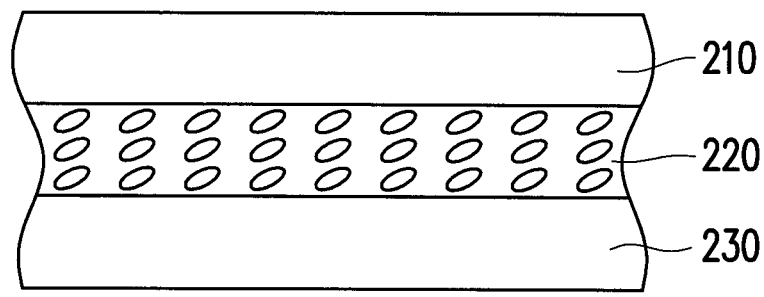
FIG. 2 is a cross-sectional schematic diagram of a portion of a display panel according to an embodiment of the invention.

FIG. 2 is a cross-sectional schematic diagram of a portion of a display panel according to an embodiment of the invention. Referring to FIG. 2, a display panel 200 includes a first substrate 210, a display medium 220, and a pixel array substrate 230. The display medium 220 is configured between the first substrate 210 and the pixel array substrate 230.

Figure 3:
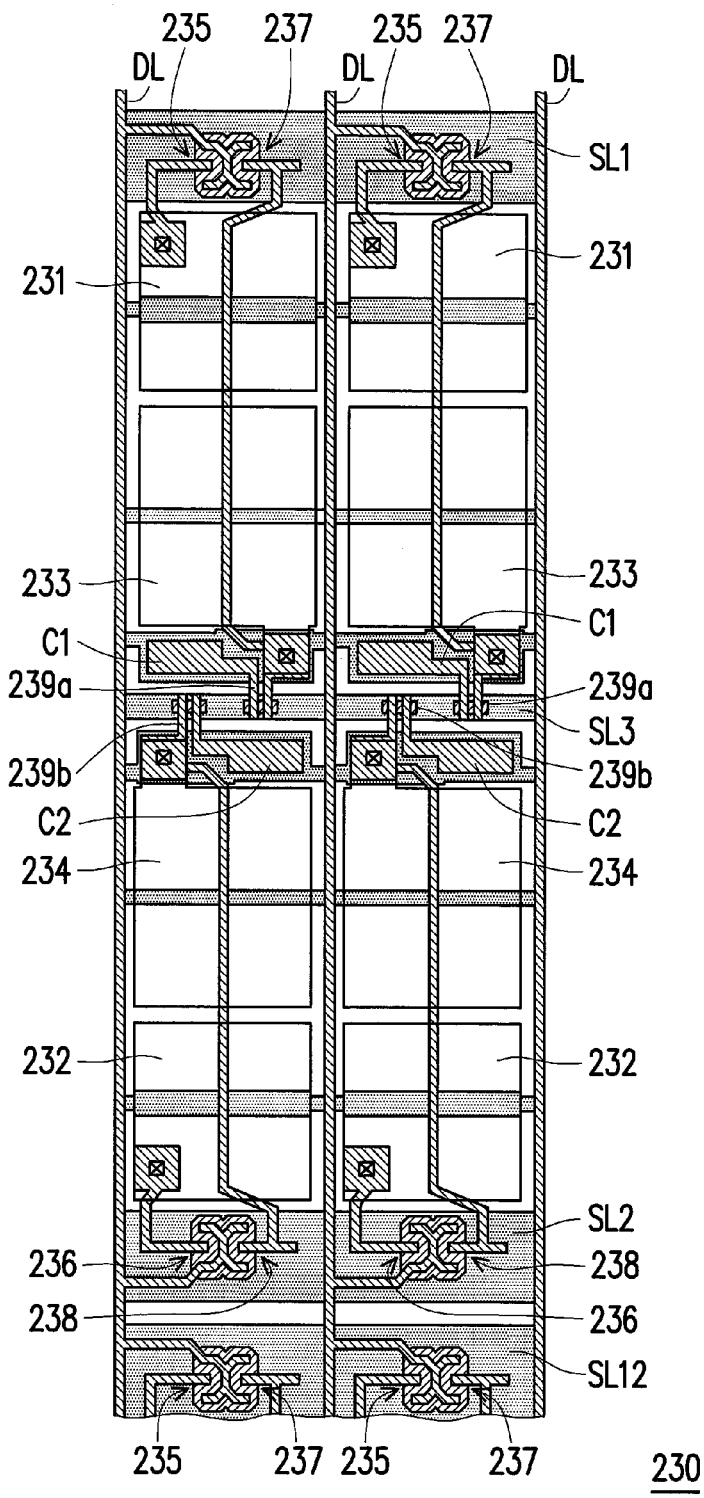
FIG. 3 is a top-view schematic diagram of a portion of a pixel array substrate in FIG. 2.
Figure 4:
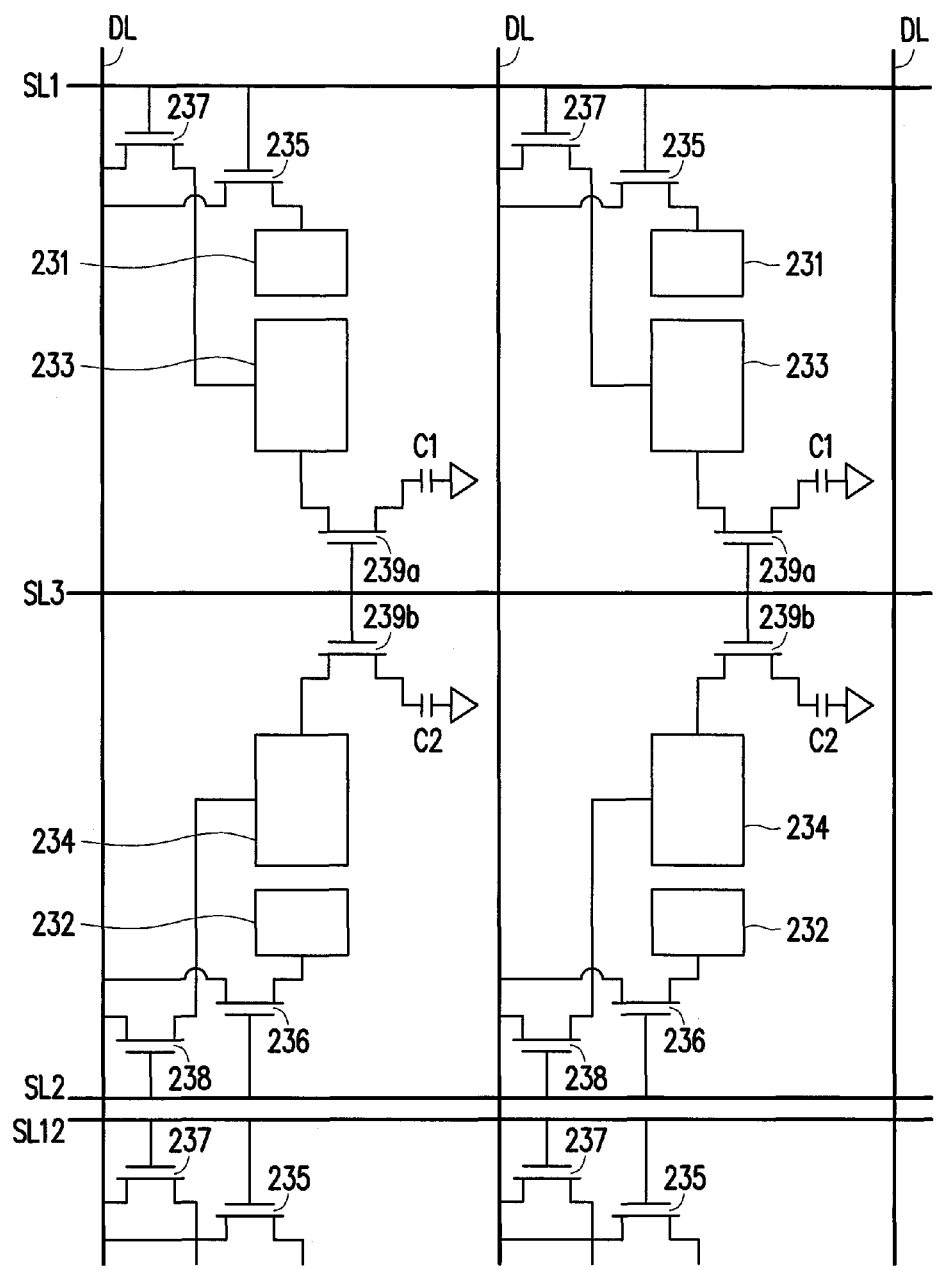
FIG. 4 is an equivalent circuit diagram of the pixel array substrate in FIG. 3.

FIG. 3 is a top-view schematic diagram of a portion of the pixel array substrate in FIG. 2, and FIG. 4 is an equivalent circuit diagram of the pixel array substrate in FIG. 3. Referring to both FIGS. 3 and 4, the pixel array substrate 230 includes a first pixel electrode 231, a second pixel electrode 232, a third pixel electrode 233, a fourth pixel electrode 234, a data line DL, a first scan line SL1, a second scan line SL2 and a third scan line SL3. In the embodiment, the display panel 200 includes a plurality of first pixel electrodes 231, a plurality of second pixel electrodes 232, a plurality of third pixel electrodes 233, a plurality of fourth pixel electrodes 234, a plurality of data lines DL, a plurality of first scan lines SL1, a plurality of second scan lines SL2 and a plurality of third scan lines SL3, for example. Since FIGS. 3 and 4 merely illustrate a portion of the pixel array substrate 230, merely one of the plurality of third scan lines SL3 are schematically illustrated.

Besides, the pixel array substrate 230 includes a first transistor 235, a second transistor 236, a third transistor 237, a fourth transistor 238 and a plurality of fifth transistors 239a and 239b. In the embodiment, the example is provided with a plurality of first transistors 235, a plurality of second transistors 236, a plurality of third transistors 237, and a plurality of fourth transistors 238, and therefore FIGS. 3 and 4 illustrate the plurality of first transistors 235, the plurality of second transistors 236, the plurality of third transistors 237, and the plurality of fourth transistors 238.

In the embodiment, the transistors may be Thin Film Transistors (TFTs), in order to serve as a switching element of each pixel unit in the pixel array substrate 230. Each of the transistors, in coordination with the corresponding data line DL, the corresponding first scan line SL1, the corresponding second scan line SL2 and the corresponding third scan line SL3, may select a specific pixel electrode, and display a corresponding display data by means of providing an adequate operating voltage.

In the embodiment, each of the plurality of first transistors 235 electrically connects to one corresponding first pixel electrode 231, each of the plurality of second transistors 236 electrically connects to one corresponding second pixel electrode 232, each of the plurality of third transistors 237 electrically connects to one corresponding third pixel electrode 233, and each of the plurality of fourth transistors 238 electrically connects to one corresponding fourth pixel electrode 234. Each of the plurality of data lines DL electrically connects to each corresponding first transistor 235, second transistor 236, third transistor 237 and fourth transistor 238.

Besides, the first scan line SL1 electrically connects to the first transistor 235 and the third transistor 237, and the second scan line SL2 electrically connects to the second transistor 236 and the fourth transistor 238. Each of the plurality of third scan lines SL3 is located between the corresponding first scan line SL1 and the corresponding second scan line SL2, and the third scan line SL3 electrically connects to each corresponding third pixel electrode 233 via the fifth transistor 239a, or to each corresponding fourth pixel electrode 234 via the fifth transistor 239b.

In the embodiment, the third scan line SL3 is used in receiving control signals for controlling each of the plurality of fifth transistors 239a and 239b, and the fifth transistors 239a and 239b further electrically connect to the corresponding third pixel electrode 233 and fourth pixel electrode 234. Thereby, the third pixel electrode 233 and the fourth pixel electrode 234 substantively adopt a design of sharing the third scan line SL3, and the design of sharing makes the display panel obtain a favorable aperture ratio.

In the embodiment, the third pixel electrode 233 is located between the first scan line SL1 and the third scan line SL3 electrically connected to the third pixel electrode 233. The first pixel electrode 231 and the third pixel electrode 233 electrically connected to the first scan line SL1 are located on the same side of the first scan line SL1. The fourth pixel electrode 234 is located between the second scan line SL2 and the third scan line SL3 electrically connected to the fourth pixel electrode 234. The second pixel electrode 232 and the fourth pixel electrode 234 electrically connected to the second scan line SL2 are located on the same side of the second scan line SL2. From another aspect, the third pixel electrode 233 and the fourth pixel electrode 234 electrically connected to the third scan line SL3 are located on the two sides of the third scan line SL3 respectively.

The pixel array substrate 230 in the embodiment further includes a plurality of capacitors C1 and C2. The fifth transistor 239a electrically connects between the corresponding capacitor C1 and the corresponding third pixel electrode 233. The fifth transistor 239b electrically connects between the corresponding capacitor C2 and the corresponding fourth pixel electrode 234.

In the embodiment, each first pixel electrode 231 and each third pixel electrode 233 are substantively located within one pixel, and each fourth pixel electrode 234 and each second pixel electrode 232 are substantively located in another identical pixel. In other words, a design of a pixel structure in the embodiment is to divide one pixel into two portions, that is a primary pixel and a secondary pixel. Scan signals are received in coordination with the data line DL and the third scan line SL3 to control the fifth transistors 239a and 239b, and the third pixel electrode 233 and the fourth pixel electrode 234 correspondingly connected to the fifth transistors 239a and 239b are controlled by means of the fifth transistors 239a and 239b. The primary pixel corresponds to the first pixel electrode 231 and the second pixel electrode 232, and the secondary pixel corresponds to the third pixel electrode 233 and the fourth pixel electrode 234.

Accordingly, the fifth transistor 239a electrically connects between the corresponding capacitor C1 and the corresponding third pixel electrode 233, and the fifth transistor 239b electrically connects between the corresponding capacitor C2 and the corresponding fourth pixel electrode 234. Thereby, when the third scan line SL3 receives a scan signal, voltages of the third pixel electrode 233 and the fourth pixel electrode 234 corresponding to the capacitors C1 and C2 may be changed by means of operation of the capacitors C1 and C2. When the voltages of the third pixel electrode 233 and the fourth pixel electrode 234 change, a gray scale value within the same pixel differs slightly, in order to improve on the problem of color washout of the display panel 200 in a large viewing angle.

Besides, both the fifth transistors 239a and 239b that may serve as control switches of the third pixel electrode 233 and the fourth pixel electrode 234 electrically connect to the third scan line SL3. Compared with the conventional technology of disposing a data line in each pixel, the design of the pixel array substrate 230 in the embodiment makes each third pixel electrode 233 and each fourth pixel electrode 234 share the corresponding third scan line SL3. That means, in the embodiment, the sub-pixel electrodes in every two pixels share a scan line. Compared with the conventional technology of disposing the data line in each pixel, the embodiment obtains a favorable aperture ratio while improving on the problem of color washout of the display panel 200 in the large viewing angle. Besides, sharing the third scan line SL3 reduces the number of driver chips controlling the scan lines, and thereby has the benefit of cost saving.

Referring to FIG. 2 again, in the embodiment, the display medium 220 of the display panel 200 may be a liquid crystal, and therefore the display panel 200 in the embodiment is substantively a liquid crystal display panel. Besides, the first substrate 210 may be a color filter substrate. The color filter substrate may include color filter films of various colors. When light passes through red, green and blue filter films in the color filter substrate, a red light, a green light and a blue light are displayed respectively, and accordingly the display panel 200 achieves the effect of color display.

Figure 5:
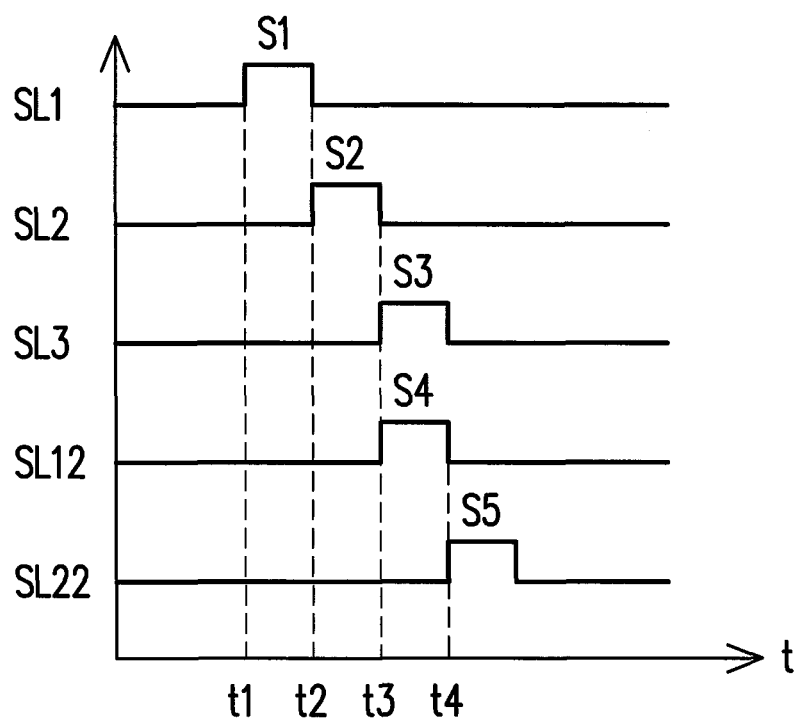
FIG. 5 is a time sequential waveform diagram of an equivalent circuit of the pixel array substrate in FIG. 4.

The configuration of each element and relevant functions thereof in the display panel 200 in the embodiment are introduced in the above, and a driving method for driving the display panel 200 is introduced in the following. FIG. 5 is a time sequential waveform diagram of an equivalent circuit of the pixel array substrate in FIG. 4. Referring to both FIGS. 4 and 5, the driving method includes the following steps. Firstly, a first scan signal S1 is provided to a No. i first scan line SL1 to turn on a plurality of first transistors 235 and a plurality of third transistors 237 electrically connected to the No. i first scan line SL1 in a first period t1 within a frame period of the display panel 200. A plurality of first display data are correspondingly written into a plurality of first pixel electrodes 231 electrically connected to the plurality of first transistors 235 electrically connected to the No. i first scan line SL1 and a plurality of third pixel electrodes 233 electrically connected to the plurality of third transistors 237 electrically connected to the No. i first scan line SL1 via a plurality of data lines DL, and the i is an integer equal to or larger than 1.

Then, a second scan signal S2 is provided to a No. i second scan line SL2 to turn on a plurality of second transistors 236 and a plurality of fourth transistors 238 electrically connected to the No. i second scan line SL2, and a plurality of second display data are correspondingly written into a plurality of second pixel electrodes 232 electrically connected to the plurality of second transistors 236 electrically connected the No. i second scan line SL2 and a plurality of fourth pixel electrodes 234 electrically connected to the plurality of fourth transistors 238 electrically connected the No. i second scan line SL2 via the plurality of data lines DL in a second period t2 within the frame period.

Next, a third scan signal S3 is provided to a No. i third scan line SL3 to turn on a plurality of fifth transistors 239a and 239b electrically connected to the No. i third scan line SL3 in a third period t3 within the frame period. Meanwhile, the plurality of first display data written into the plurality of third pixel electrodes 233 electrically connected to the fifth transistors 239a electrically connected to the No. i first scan line SL1 and the plurality of second display data written into the plurality of fourth pixel electrodes 234 electrically connected to the fifth transistors 239b electrically connected to the No. i second scan line SL2 are influenced. Synchronously, a fourth scan signal S4 is provided to a No. i+1 first scan line SL12 to turn on a plurality of first transistors 235 and a plurality of third transistors 237 electrically connected to the No. i+1 first scan line SL12, and a plurality of third display data are correspondingly written into the first pixel electrodes 231 electrically connected to the first transistors 235 electrically connected to the No. i+1 first scan line SL12 and the third pixel electrodes 233 electrically connected to the third transistors 237 electrically connected to the No. i+1 first scan line SL12 via the plurality of data lines DL.

Afterwards, a fifth scan signal S5 is provided to a No. i+1 second scan line SL22 (not shown in FIG. 4 and schematically demonstrated in FIG. 5) to turn on a plurality of second transistors 236 and a plurality of fourth transistors 238 electrically connected to the No. i+1 second scan line SL22, and a plurality of fourth display data are correspondingly written into a second pixel electrode 232 electrically connected to the second transistor 236 electrically connected to the No. i+1 second scan line SL22 and a fourth pixel electrode 234 electrically connected to the No. i+1 second scan line SL22 (not shown in FIG. 4) connected to the fourth transistor 238 correspondingly electrically connected to the No. i+1 second scan line SL22 via the plurality of data lines DL in a fourth period t4 within the frame period.

More specifically, in the embodiment, since the fifth transistor 239a connects between the third pixel electrode 233 and a corresponding capacitor C1, and the fifth transistor 239b connects between the fourth pixel electrode 234 and a corresponding capacitor C2, the fifth transistors 239a and 239b control the corresponding capacitors C1 and C2 respectively to influence voltages of the corresponding third pixel electrode 233 and fourth pixel electrode 234 when the third scan line SL3 receives the third scan signal S3 in the third period t3 within the frame period.

More concretely, the first pixel electrode 231 and the third pixel electrode 233 are located in the same pixel, and the second pixel electrode 232 and the fourth pixel electrode 234 are located in the same pixel. Thereby, when the voltages of the third pixel electrode 233 and the fourth pixel electrode 234 change, there is a voltage difference between the first pixel electrode 231 and the third pixel electrode 233; on the other hand, there is also a voltage difference between the fourth pixel electrode 234 and the second pixel electrode 232. If there is the voltage difference between the first pixel electrode 231 and the third pixel electrode 233 within the same pixel, the gray scale values thereof are different, and the problem that the colors in the display panel 200 appear lighter in a large viewing angle is improved. Similarly, the same effect is achieved if there is the voltage difference between the second pixel electrode 232 and the fourth pixel electrode 234.

Besides, in the third period t3 within the frame period, the fifth transistors 239a and 239b controlling and making each of the pixel electrodes within the same pixel have the voltage difference electrically connect to the third scan line SL3. Thereby, at the mean time that the third scan line SL3 receives the third scan signal S3 and makes the voltage difference between each of the pixel electrodes within the same pixel change, a fourth scan signal S4 may be synchronously provided to the No. i+1 first scan line SL12 to turn on the plurality of first transistors 235 and the plurality of third transistors 237 electrically connected to the No. i+1 first scan line SL12, and the plurality of third display data may be correspondingly written into the plurality of first pixel electrodes 231 electrically connected to the plurality of first transistors 235 electrically connected to the No. i+1 first scan line SL12 and the plurality of third pixel electrodes 233 electrically connected to the plurality of third transistors 237 electrically connected to the No. i+1 first scan line SL12 via the plurality of data lines DL. Besides, although the driving method applies to a circumstance of a forward scan in the display panel 200, the driving method in the embodiment is similarly suitable when a circumstance of a reverse scan is adopted in the display panel 200. The steps of the reverse scan are similar to those of the forward scan, and therefore the steps are not elaborated here.

Based on the above, the display panel of the invention includes a plurality of third scan lines shared by pixel electrodes within different pixels, and the shared scan lines are used to increase the aperture ratio of the display panel. Besides, the plurality of fifth transistors electrically connected to the third scan lines may serve as the control switches controlling whether the scan signals enter each of the pixel electrodes connected to the third scan lines. In coordination with the capacitors electrically connected to each of the fifth transistors, the voltage of each of the pixel electrodes connected to the third scan lines may be changed, in order to improve on the problem of color washout of the display panel in the large viewing angle. In addition, in the driving method for driving the display panel provided in the invention, the third scan signal may be provided to the No. i third scan line and the fourth scan signal may be provided to the No. i+1 first scan line simultaneously within one particular display period in the frame period, in order to solve the problem of color washout of the display panel. The driving method is suitable for the circumstances of both the forward scan and the reverse scan in the display panel.

Although the invention has been described with reference to the above embodiments, it is apparent to one of ordinary skill in the art that modifications and variations of the described embodiments may be made without departing from the spirit of the invention. Accordingly, the scope of the invention shall be defined by the attached claims, rather than by the above detailed descriptions.

What is claimed is:
1. A display panel, comprising:
   a first substrate;
   a display medium;

a pixel array substrate, wherein the display medium is configured between the first substrate and the pixel array substrate, the pixel array substrate comprising:

a plurality of first pixel electrodes;

a plurality of second pixel electrodes;

a plurality of third pixel electrodes;

a plurality of fourth pixel electrodes;

a plurality of first transistors, electrically connected to the plurality of first pixel electrodes;

a plurality of second transistors, electrically connected to the plurality of second pixel electrodes;

a plurality of third transistors, electrically connected to the plurality of third pixel electrodes;

a plurality of fourth transistors, electrically connected to the plurality of fourth pixel electrodes;

a plurality of fifth transistors;

a plurality of data lines, electrically connected to the corresponding first transistors, the corresponding second transistors, the corresponding third transistors, and the corresponding fourth transistors;

a plurality of first scan lines, electrically connected to the plurality of first transistors and the plurality of third transistors, wherein the plurality of first transistors and the plurality of third transistors electrically connected to a No. i first scan line are configured to be turned on by the No. i first scan line in a first period within a frame period such that a plurality of first display data are correspondingly written into the plurality of first pixel electrodes electrically connected to the plurality of first transistors electrically connected to the No. i first scan line and the plurality of third pixel electrodes electrically connected to the plurality of third transistors electrically connected to the No. i first scan line via the plurality of data lines, wherein i is an integer equal to or larger than 1;

a plurality of second scan lines, electrically connected to the plurality of second transistors and the plurality of fourth transistors, wherein the plurality of second transistors and the plurality of fourth transistors electrically connected to a No. i second scan line are configured to be turned on by the No. i second scan line in a second period within the frame period such that a plurality of second display data are correspondingly written into the plurality of second pixel electrodes electrically connected to the plurality of second transistors electrically connected to the No. i second scan line and the plurality of fourth pixel electrodes electrically connected to the plurality of fourth transistors electrically connected to the No. i second scan line via the plurality of data lines; and a plurality of third scan lines, disposed between the corresponding first scan lines and the corresponding second scan lines, each of the plurality of third scan lines being electrically connected to the corresponding third pixel electrodes and the corresponding fourth pixel electrodes via the plurality of fifth transistors, wherein the plurality of fifth transistors electrically connected to a No. i third scan line are configured to be turned on by the No. i third scan line in a third period within the frame period such that the plurality of first display data written into the plurality of third pixel electrodes electrically connected to the No. i first scan line and the plurality of second display data written into the plurality of fourth pixel electrodes electrically connected to the No. i second scan line are being influenced, and the plurality of first transistors and the plurality of third transistors electrically connected to a No. i+1 first scan line are configured to be turned on by the No. i+1 first scan line in the third period within the frame period such that a plurality of third display data are correspondingly written into the plurality of first pixel electrodes electrically connected to the plurality of first transistors electrically connected to the No. i+1 first scan line and the plurality of third pixel electrodes electrically connected to the plurality of third transistors electrically connected to the No. i+1 first scan line via the plurality of data lines, wherein the plurality of first transistors and the plurality of third transistors electrically connected to the No. i+1 first scan line and the plurality of fifth transistors electrically connected to the No. i third scan line are configured to be turned on simultaneously.

2. The display panel as claimed in claim 1, wherein each of the plurality of third pixel electrodes is located between the first scan line and the third scan line electrically connected thereto.

3. The display panel as claimed in claim 2, wherein the plurality of first pixel electrodes and the plurality of third pixel electrodes electrically connected to each of the plurality of first scan lines are located on the same side of the each of the plurality of first scan lines.

4. The display panel as claimed in claim 1, wherein each of the plurality of fourth pixel electrodes is located between the second scan line and the third scan line electrically connected thereto.

5. The display panel as claimed in claim 4, wherein the plurality of second pixel electrodes and the plurality of fourth pixel electrodes electrically connected to each of the plurality of second scan lines are located on the same side of the each of the plurality of second scan lines.

6. The display panel as claimed in claim 1, wherein the pixel array substrate further comprises a plurality of capacitors, each of the plurality of fifth transistors being electrically connected between the corresponding capacitor and the corresponding third pixel electrode, or electrically connected between the corresponding capacitor and the corresponding fourth pixel electrode.

7. The display panel as claimed in claim 1, wherein the display medium is liquid crystal.

8. The display panel as claimed in claim 1, wherein the first substrate is a color filter substrate.

9. The display panel as claimed in claim 1, wherein the No. i second scan line is immediately adjacent to the No. i+1 first scan line, and the plurality of first pixel electrodes electrically connected to the No. i+1 first scan line is immediately adjacent to the No. i+1 first scan line.

10. The display panel as claimed in claim 1, wherein the No. i second scan line is immediately adjacent to the No. i+1 first scan line.

11. A driving method for driving the display panel as claimed in claim 1, the driving method comprising:

in a first period within a frame period of the display panel, providing a first scan signal to a No. i first scan line to turn on the plurality of first transistors and the plurality of third transistors electrically connected to the No. i first scan line, and correspondingly writing a plurality of first display data into the plurality of first pixel electrodes electrically connected to the plurality of first transistors electrically connected to the No. i first scan line and the plurality of third pixel electrodes electrically connected to the plurality of third transistors electrically connected to the No. i first scan line via the plurality of data lines, wherein i is an integer equal to or larger than 1;

in a second period within the frame period, providing a second scan signal to a No. i second scan line to turn on the plurality of second transistors and the plurality of fourth transistors electrically connected to the No. i second scan line, and correspondingly writing a plurality of second display data into the plurality of second pixel electrodes electrically connected to the plurality of second transistors electrically connected to the No. i second scan line and the plurality of fourth pixel electrodes electrically connected to the plurality of fourth transistors electrically connected to the No. i second scan line via the plurality of data lines;

in a third period within the frame period, providing a third scan signal to a No. i third scan line to turn on the plurality of fifth transistors electrically connected to the No. i third scan line and to influence the plurality of first display data written into the plurality of third pixel electrodes electrically connected to the No. i first scan line and the plurality of second display data written into the plurality of fourth pixel electrodes electrically connected to the No. i second scan line, and synchronously providing a fourth scan signal to a No. i+1 first scan line to turn on the plurality of first transistors and the plurality of third transistors electrically connected to the No. i+1 first scan line, and correspondingly writing a plurality of third display data into the plurality of first pixel electrodes electrically connected to the plurality of first transistors electrically connected to the No. i+1 first scan line and the plurality of third pixel electrodes electrically connected to the plurality of third transistors electrically connected to the No. i+1 first scan line via the plurality of data lines; and in a fourth period after the third period within the frame period, providing a fifth scan signal to a No. i+1 second scan line to turn on the plurality of second transistors and the plurality of fourth transistors electrically connected to the No. i+1 second scan line, and correspondingly writing a plurality of fourth display data into the plurality of second pixel electrodes electrically connected to the plurality of second transistors electrically connected to the No. i+1 second scan line and the plurality of fourth pixel electrodes electrically connected to the plurality of fourth transistors electrically connected to the No. i+1 second scan line via the plurality of data lines.

12. The driving method as claimed in claim 11, wherein the No. i second scan line is immediately adjacent to the No. i+1 first scan line.

13. A display panel, comprising:
two first pixel electrodes;
a second pixel electrode;
two third pixel electrodes;
a fourth pixel electrode;
two first transistors, each of the first transistors is electrically connected to the corresponding first pixel electrode;
a second transistor, electrically connected to the second pixel electrode;
two third transistors, each of the third transistors is electrically connected to the corresponding third pixel electrode;
a fourth transistor, electrically connected to the fourth pixel electrode;
two fifth transistors, one of the fifth transistors being electrically connected to one of the third pixel electrodes, and the other of the fifth transistors being electrically connected to the fourth pixel electrode;

a data line, electrically connected to the first transistors, the second transistor, the third transistors and the fourth transistor;
two first scan lines, comprising a No. i first scan line and a No. i+1 first scan line, wherein the No. i first scan line is electrically connected to one of the first transistors and one of the third transistors which is electrically connected to the one of the third pixel electrodes, and i is an integer equal to or larger than 1;
a second scan line, electrically connected to the second transistor and the fourth transistor, wherein the No. i+1 first scan line is disposed immediately adjacent to the second scan line, and the No. i+1 first scan line is electrically connected to the other of the first transistors and the other of the third transistors; and
a third scan line, electrically connected to the fifth transistors.

14. The display panel as claimed in claim 13, wherein the one of the third pixel electrodes is located between the No. i first scan line and the third scan line electrically connected thereto.

15. The display panel as claimed in claim 14, wherein the first pixel electrode and the third pixel electrode electrically connected to the No. i first scan line are located on the same side of the No. i first scan line.

16. The display panel as claimed in claim 13, wherein the fourth pixel electrode is located between the second scan line and the third scan line electrically connected thereto.

17. The display panel as claimed in claim 16, wherein the second pixel electrode and the fourth pixel electrode electrically connected to the second scan line are located on the same side of the second scan line.

18. The display panel as claimed in claim 13, further comprising a plurality of capacitors, one of the fifth transistors being electrically connected between the corresponding capacitor and the one of the third pixel electrodes, and the other of the fifth transistors being electrically connected between the corresponding capacitor and the fourth pixel electrode.

19. The display panel as claimed in claim 13, wherein the one of the first transistors and the one of the third transistors electrically connected to the No. i first scan line are configured to be turned on by the No. i first scan line in a first period within a frame period, the second transistor and the fourth transistor electrically connected to the second scan line are configured to be turned on by the second scan line in a second period within the frame period, the two fifth transistors electrically connected to the third scan line are configured to be turned on by the third scan line in a third period within the frame period, the other of the first transistors and the other of the third transistors electrically connected to the No. i+1 first scan line are configured to be turned on by the No. i+1 first scan line in the third period within the frame period, wherein the other of the first transistors and the other of the third transistors electrically connected to the No. i+1 first scan line and the two fifth transistors electrically connected to the third scan line are configured to be turned on simultaneously.

20. The display panel as claimed in claim 13, wherein the No. i second scan line is immediately adjacent to the No. i+1 first scan line.

* * * * *